US008039041B2

(12) United States Patent
Pichler et al.

(10) Patent No.: US 8,039,041 B2
(45) Date of Patent: Oct. 18, 2011

(54) ELECTROLUMINESCENT DEVICES WITH ELECTRODE PROTECTION

(75) Inventors: Karl Pichler, Hopewell Junction, NY (US); Carl Towns, Stanstead Essex (GB)

(73) Assignee: Cambridge Display Technology, Ltd., Cambridge (GB)

( * ) Notice: Subject to any disclaimer, the term of this patent is extended or adjusted under 35 U.S.C. 154(b) by 0 days.

(21) Appl. No.: 12/200,442

(22) Filed: Aug. 28, 2008

(65) Prior Publication Data
US 2009/0017191 A1 Jan. 15, 2009

Related U.S. Application Data

(63) Continuation of application No. 11/404,677, filed on Apr. 14, 2006, now abandoned, and a continuation of application No. 10/615,924, filed on Jul. 10, 2003, now Pat. No. 7,151,341, and a continuation of application No. 09/230,401, filed on May 10, 1999, now Pat. No. 6,605,823.

(30) Foreign Application Priority Data

| Jul. 29, 1996 | (GB) | 9615883.7 |
| Sep. 17, 1996 | (GB) | 9619382.6 |
| Nov. 28, 1996 | (GB) | 9624707.7 |
| Feb. 15, 1997 | (GB) | 9703172.8 |
| Jul. 29, 1997 | (WO) | PCT/GB97/02039 |

(51) Int. Cl.
*B05D 5/06* (2006.01)
*B05D 1/02* (2006.01)

(52) U.S. Cl. ....... 427/66; 427/427.5; 313/503; 428/917; 445/24

(58) Field of Classification Search ............. 427/66, 427/427.5; 445/24; 428/917; 313/504
See application file for complete search history.

(56) References Cited

U.S. PATENT DOCUMENTS

| 5,200,668 | A | | 4/1993 | Ohashi |
| 5,247,190 | A | | 9/1993 | Friend |
| 5,317,169 | A | | 5/1994 | Nakano |
| 5,343,050 | A | | 8/1994 | Egusa et al. |
| 5,504,183 | A | * | 4/1996 | Shi et al. ........ 528/272 |
| 5,558,904 | A | | 9/1996 | Hsieh |
| 5,652,067 | A | * | 7/1997 | Ito et al. ........ 428/690 |
| 5,710,484 | A | | 1/1998 | Iwanaga et al. |

(Continued)

FOREIGN PATENT DOCUMENTS

EP 0443861 A2 8/1991
(Continued)

OTHER PUBLICATIONS

Database WPI, Section Ch, Week 9343, Derwent Publications Ltd., London, GB; AN 93-339976, XP002040832 & JP 05 247 460 A (Sumitomo Chem Co., Ltd.), Sep. 24, 1993.

(Continued)

*Primary Examiner* — James Lin
(74) *Attorney, Agent, or Firm* — Rissman Hendricks & Oliverio LLP

(57) ABSTRACT

A method of manufacturing an electroluminescent device which has an anode and a cathode and arranged between the anode and the cathode a light emissive layer, also includes an anode protection layer which protects the anode against the effects of converting a precursor polymer to a semiconductive conjugated polymer which constitutes the light emissive layer. This has been found to increase the brightness and half-life of devices.

1 Claim, 5 Drawing Sheets

U.S. PATENT DOCUMENTS

| | | | |
|---|---|---|---|
| 5,747,182 A | 5/1998 | Friend | |
| 5,759,709 A | 6/1998 | Doi | |
| 5,766,515 A | 6/1998 | Jonas | |
| 5,777,070 A * | 7/1998 | Inbasekaran et al. | 528/394 |
| 5,814,417 A | 9/1998 | Nagayama | |
| 5,821,002 A | 10/1998 | Onnishi | |
| 5,902,688 A | 5/1999 | Antoniadis et al. | |
| 5,965,281 A | 10/1999 | Cao | |
| 5,965,901 A | 10/1999 | Heeks | |
| 5,969,475 A | 10/1999 | Friend | |
| 5,980,781 A | 11/1999 | Doi | |
| 5,981,092 A | 11/1999 | Arai | |
| 6,002,206 A | 12/1999 | Harrison | |
| 6,416,885 B1 | 7/2002 | Towns | |

FOREIGN PATENT DOCUMENTS

| | | | |
|---|---|---|---|
| JP | 03-222148 | | 7/1991 |
| JP | 05-041285 | | 2/1993 |
| JP | 06-231881 | | 8/1994 |
| JP | 08-288069 | | 1/1996 |
| JP | 08-288069 | * | 11/1996 |
| JP | 09-045479 | | 2/1997 |
| JP | 11224781 A | | 8/1999 |
| WO | WO 95/24056 | | 8/1995 |
| WO | WO 00/06665 | | 2/2000 |

OTHER PUBLICATIONS

Database WPI, Section El, Week 9717, Derwent Publications Ltd., London, GB; AN 97-185433, XP002040833 & JP 09 045 479 A (Hewlett Packard Co.), Feb. 14, 1997.

Gruner et al. "Emission enhancement in single-layer conjugated polymer microcavitities," Journal of Appl. Phys. 80(1) Jul. 1996.

Cao et al., "Polymer light emitting diodes with polyethylene, dioxythiopene polystyrene sulfonate as the transparent anode," Synthetic metals, 87(1997) 171-174.

Tokito et al., "Metal oxides as a hole-injecting layer for an organic electroluminescent device," J. Phys. D: Appl. Phys. 29(1996) 2750-2753.

Groenendaal et al., "Poly(3,4-ethylenedioxythiophene) and Its Derivatives: Past, Present, and Future," Wiley-VCH Verlag GMBH, D-69469 Weinheim, 2000.

* cited by examiner

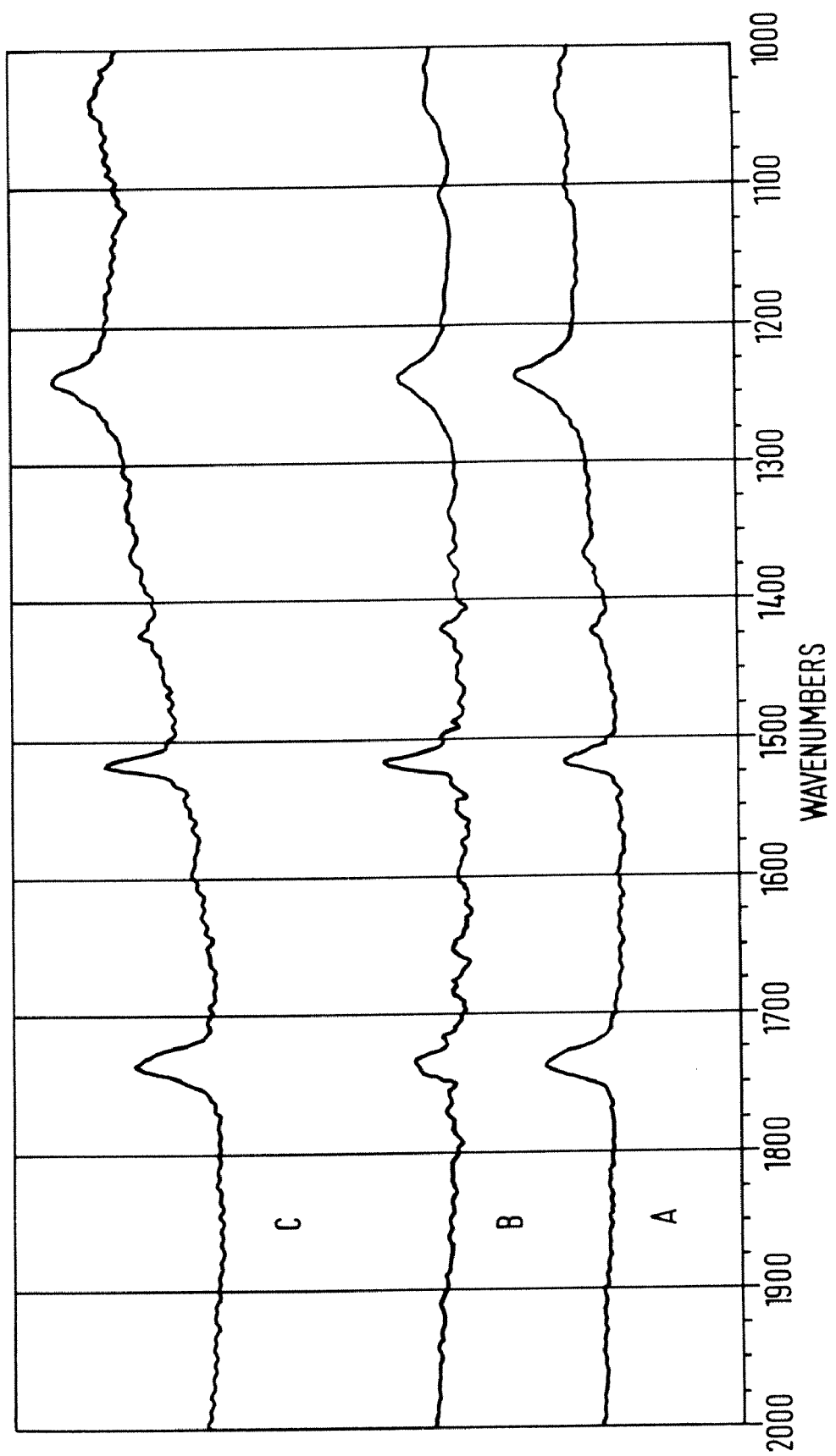

ELECTROLUMINESCENT DEVICES WITH ELECTRODE PROTECTION

FIELD OF THE INVENTION

This invention relates to the construction of organic electroluminescent (EL) devices.

BACKGROUND OF THE INVENTION

Organic electroluminescent devices are made from materials that emit light when a suitable voltage is applied across electrodes deposited on either side of the material. One class of such materials is semiconductive conjugated polymers which have been described in our earlier patent U.S. Pat. No. 5,247,190, the contents of which are herein incorporated by reference. Poly(p-phenylene vinylene) [PPV], for instance, will emit light when positive and negative charge carriers are passed through the material by applying a voltage between two suitable electrodes. The electroluminescent efficiency of these devices depends on the balancing of the electrons and holes that are injected into the device and meet to form electron/hole pairs, as well as on the efficiency with which these electron/hole pairs combine to radiate light, i.e. the photoluminescence efficiency (for example, see N. C. Greenham and R. H. Friend, Solid State Physics, 49, 1, 1995). Therefore it is of importance for an efficient device to have sufficiently high photoluminescence efficiency.

There are several approaches used for the processing of conjugated polymers. One approach uses a precursor polymer which is soluble and can therefore be easily coated by standard solution-based processing techniques (for example, spin-coating and blade-coating). The precursor is then converted in situ by suitable heat treatment to give the conjugated and insoluble polymer. Another approach uses directly soluble conjugated polymers which do not require a subsequent conversion stage. Depending on the specific application, one or other of the approaches might be relevant. The precursor polymers approach can be especially important where subsequent processing might lead to damage of the polymer film if it were directly soluble—such processing may be, for instance, coating with further polymer layers (for example, transport layers or emitting layers of different colour), or patterning of the top electrode. Converted precursor films also have better thermal stability which is of importance both during fabrication but also for the storage and operation of devices at high temperatures.

Where the precursor polymer is converted to the final form by elimination or modification of a solubilising group it is generally important that these by-products of the conversion process are removed from the film. It may also be important that they do not interact with the substrate during this process, for example if this causes harmful impurities to move into the film from the substrate thus affecting the performance (including luminescence efficiency and lifetime) of the electroluminescent device. We have observed, for instance, a quenching of the photoluminescence when precursor PPV polymers are converted on conductive oxide substrates such as indium tin oxide. This, we believe, may be caused by indium compounds being released into the PPV due to the reaction of one of the conversion by-products (for example, hydrogen halide) with the indium tin oxide.

In addition to the observation of quenching via the presence of impurities from the interaction of by-products with indium tin oxide during conversion, we have also observed detrimental effects due to the enhanced conversion of certain PPV copolymers. Such copolymers normally have limited conjugation lengths as compared to the homopolymer case. This normally leads to exciton confinement and therefore high photoluminescence and electroluminescence efficiencies. In this case, we believe that the indium compounds present in certain PPV copolymers films when converted on indium tin oxide can catalyse the elimination of groups designed to survive the conversion process.

SUMMARY OF THE INVENTION

The invention provides a device structure and a method of manufacture for an electroluminescent device that overcomes this problem.

According to one aspect of the invention there is provided a method of manufacturing an electroluminescent device comprising the steps of:

forming an anode of a positive charge carrier injecting material;

forming an anode protection layer on the anode of a protection material selected from the group comprising: polypyrroles and their derivatives; polythiophenes and their derivatives; polyvinylcarbazole (PVK); polystyrene; poly(vinyl pyridine); dielectric materials; carbon; amorphous silicon; non-indium containing conductive oxides including tin oxide, zinc oxide, vanadium oxide, molybdenum oxide and nickel oxide; and sublimed organic semiconductors;

forming a light emissive layer by converting a precursor to a polymer being a semiconductive conjugated polymer; and forming a cathode of a negative charge carrier injecting material.

The anode protection layer has been found to be particularly valuable when the light emissive layer is a polymer which releases acidic by products (e.g. hydrogen halides) during the conversion from the precursor to the conjugated polymer.

Another aspect of the invention provides an electroluminescent device comprising:

an anode formed of a positive charge carrier injecting material;

an anode protection layer on the anode formed of a protection material selected from the group comprising: polypyrroles and their derivatives; polythiophenes and their derivatives; polyvinylcarbazole (PVK); polystyrene; poly(vinyl pyridine); dielectric materials; carbon; amorphous silicon; non-indium containing conductive oxides including tin oxide, zinc oxide, vanadium oxide, molybdenum oxide, and nickel oxide; and sublimed organic semiconductors;

a light emissive layer formed of a semiconductive conjugated polymer; and a cathode formed of a negative charge carrier injecting material.

The invention is particularly useful when the anode is formed of indium tin oxide (ITO). However other materials are suitable, such as tin oxide.

In one embodiment a layer of transparent conducting material deposited on glass or plastic forms the anode of the device. Examples of suitable anodes include tin oxide and indium tin oxide. Typical layer thicknesses are 500-2000 Å and sheet resistances are 10-100 Ohm/square, and preferably <30 Ohm/square. The converted precursor polymer can be, for instance, poly(p-phenylene vinylene) (PPV3 or a homopolymer or copolymer derivative of PPV. The thickness of this layer can be in the range 100-3000 Å, preferably 500-2000 Å and more preferably 1000-2000 Å. The thickness of the precursor layer prior to conversion can be in the range 100-6000 Å for spin-coated layers and up to 200 μm for blade coating. The anode protection layer is chosen to act as a barrier against the conversion by-products of the precursor polymer, but also should not act as a barrier to the injection of holes from the anode into the emitting layer, where they combine with electrons injected from the cathode to radiate light. Conducting polymers are a general class of materials that can combine ease of processing, protection of the underlying electrode, and suitable hole transporting and injecting properties and are therefore good candidates. Thin layers of between 10-2000 Å and preferably 10-500 Å may be used and therefore the transparency of the layer can be high. Typical sheet resistances of these layers are 100-1000 Ohm/square, but can be as high as in excess of $10^{10}$ Ω/squ. Examples include conjugated polymers that have been doped including polythiophenes, polyanilines, polypyrroles, and derivatives thereof. The cathode electrode is placed on the other side of the converted precursor material and completes the device structure. Furthermore, undoped conjugated polymers, as listed above, may also be used where the doping occurs in situ, by interaction with the conversion by-products during device manufacture.

The invention also provides use of an electrode protection layer in the manufacture of an organic light emitting device to protect an electrode of the organic light emitting device from the effects of conversion of a precursor into a light emitting semiconductive conjugated polymer, wherein the organic light emitting device comprises first and second electrodes with the light emitting polymer being located between them.

Thus, in another embodiment the electrode protection layer and the precursor polymer is deposited on the cathode, typically a material such as aluminium or an alloy of aluminium with a low work function element or any low work function element or alloy. In this case the protection layer will need to transport electrons, but may or may not need to be transparent. Again conducting polymers are suitable candidates as cathode protection layers. The anode electrode is placed on the other side of the converted precursor material and completes the device structure.

In yet another embodiment a protection layer to either the anode or cathode as described above is provided but where the protection layer is an undoped conjugated polymer but which has sufficient injection properties and transport mobilities for either holes or electrons depending on whether it is protecting the anode or cathode respectively. An example of such a protection layer would be a soluble PPV derivative or alternatively a precursor PPV or PPV derivative material. In the latter case, if the protection layer is much thinner than the electroluminescence layer, the by-products of the conversion process are more easily removed and therefore any interaction with the electrode during conversion is reduced.

In yet another embodiment a protection layer to either the anode or cathode as described above is provided, but where the protection layer is an evaporated, sputtered, or reactively sputtered thin film which has sufficient injection properties and transport mobilities for either holes or electrons depending on whether it is protecting the anode or cathode respectively. An example of such a protection layer would be a thin layer of sputtered or evaporated carbon, a sputtered layer of amorphous silicon or non-indium containing conductive oxides including tin oxide, zinc oxide, vanadium oxide, molybdenum oxide, and nickel oxide, or a sublimed organic semiconductor layer.

In yet another embodiment a protection layer to either the cathode or anode as described above is provided, but where the protection layer is an undoped and non-conjugated polymer but which has sufficient injection properties and transport mobilities for either holes or electrons depending on whether it is protecting the anode or cathode respectively. An example would be polyvinyl carbazole which is a good hole transporting material but is not a conjugated polymer. Alternatively very thin layers of polymer materials which have relatively poor hole and electron mobilities may function as good electrode protectors without compromising the balance of electron and hole charge carriers. Examples would be polystyrene and poly(vinyl pyridine).

In yet another embodiment a protection layer to either the cathode or anode as described above is provided, but where the protection layer is a very thin inorganic dielectric which provides a barrier to the precursor conversion by-products, but which is thin enough that holes can tunnel through it when it is in contact and protecting the anode or electrons can tunnel through it when it is in contact and protecting the cathode.

The invention also provides a method of manufacturing an electroluminescent device comprising the steps of:
  forming an anode of a positive charge injecting material;
  forming a sacrificial anode protection layer over the anode;
  depositing a precursor to a semiconductive conjugated polymer on the sacrificial layer;
  converting the precursor to a semiconductive conjugated polymer to form a light emitting layer, during which conversion step the anode protection layer protects the anode from the effects of the conversion and is itself consumed; and
  forming a cathode of a negative charge injecting material.

Thus, in another embodiment a protection layer for either the anode or the cathode as described above is provided, but where the protection layer is a sacrificial layer. During the conversion process the sacrificial layer is etched away by the conversion by-products, the subsequence products of this interaction are chosen such that they do not interfere with the photoluminescence or electroluminescence efficiencies of the converted precursor conjugated polymers. Examples of such protection layers would include non-stoichiometric oxide films, such as silicon and aluminium oxides, the layer thickness being determined by the degree of interaction during the conversion process.

The invention also provides an organic light-emitting device, comprising:
  an electrode;
  an organic light-emissive layer formed from converted organic precursor; and
  an electrode protection layer formed between the electrode and the light-emissive layer so as to protect the electrode during conversion of the organic precursor.

The invention also provides a method of manufacturing an organic light-emitting device, comprising the steps of:
  depositing an electrode;
  depositing an electrode protection layer over the electrode;
  depositing a layer of an organic precursor for a light-emissive material; and
  converting the organic precursor into the light-emissive material;
  wherein the electrode protection layer protects the electrode during conversion of the organic precursor.

BRIEF DESCRIPTION OF THE DRAWINGS

FIG. 5 is a diagram illustrating the IR spectra of an acetate based copolymer converted on silicon, silicon with an indium layer, and silicon with an indium layer and protection layer.

For a better understanding of the present invention and to show how the same may be carried into effect reference will now be made by way of example to the above referenced drawings.

DESCRIPTION OF THE PREFERRED EMBODIMENTS

Figure 1A:
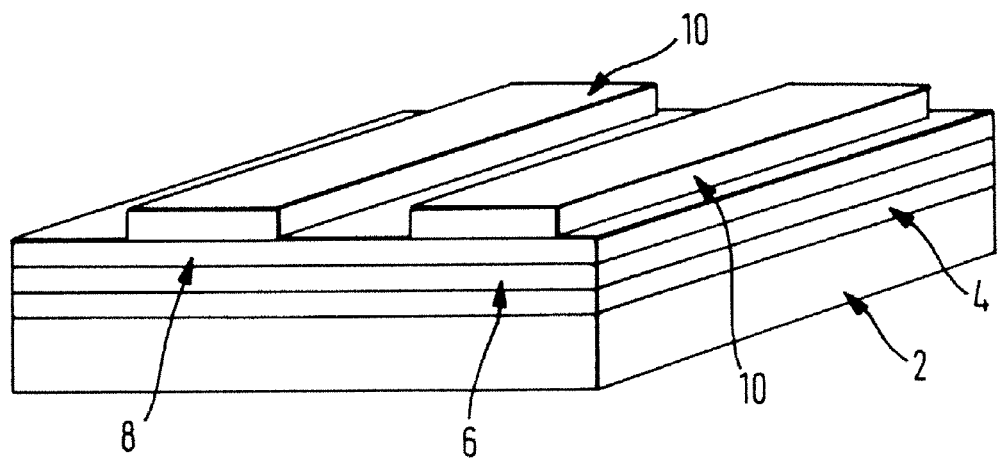
FIGS. 1A to 1C are diagrams of an electroluminescent device incorporating an anode protection layer.

FIG. 1A illustrates a structure of an electroluminescent device. A substrate 2 formed of a transparent glass or plastics material is coated with a material constituting an anode 4 of the device. An anode protection layer 6 is located between the anode 4 and a light emitting layer 8. Cathode strips 10 are provided delineating with the anode 4 light emitting areas of the device. The operation of this device to emit light (without the anode protection layer) is discussed in our preceding referenced patent U.S. Pat. No. 5,247,190 and will not be described further herein except to the extent that it is affected by the present invention.

Embodiment I

Figure 2:
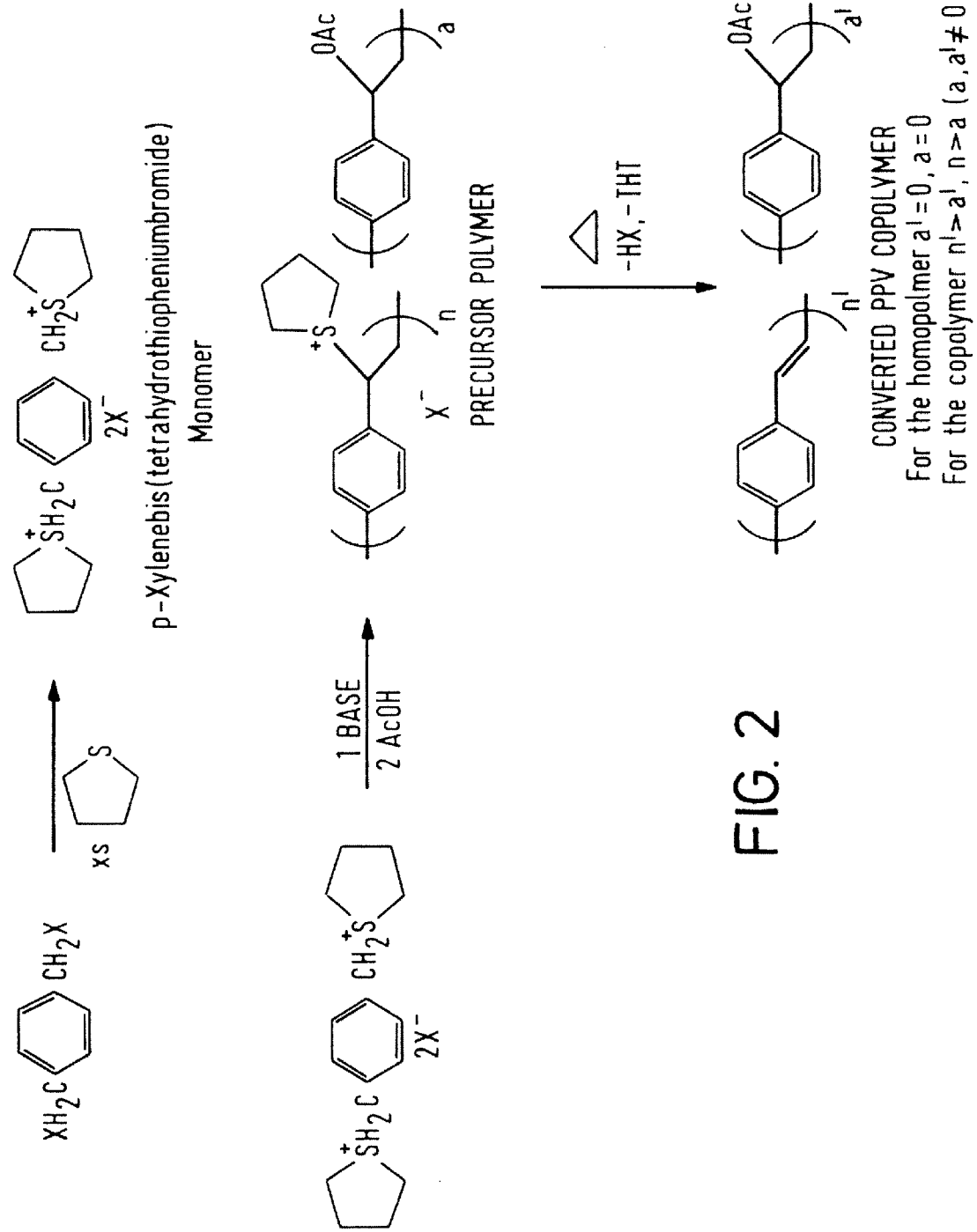
FIG. 2 illustrates two conversion routes of a precursor to PPV.

A first embodiment is now described. Indium tin oxide constituting the anode 4 is deposited using either dc or rf sputtering techniques onto the polished glass substrate 2. Such substrates are available commercially. Soda lime glass with a thin silica barrier and an indium tin oxide layer of resistivity of 30 Ohm/square and transparency of about 85%, with a thickness of order 1500 Å, can be used. A polythiophene based conducting polymer system is used as the anode protection layer 6. Polyethylene dioxythiophene/polystyrene sulphonate (PEDT/PSS @ 1:1.2 molar ratio)—which is available from Sayer AG, Leverkusen, Germany as Trial Product AI 4071. A 100 Å film of the conducting polymer is spin-coated on the substrate. The EL layer 8 is formed by spin-coating a precursor polymer such as a homopolymer PPV. With this precursor polymer the solubilising group that is removed during conversion at 150° C. in nitrogen for 4 hours is tetrahydrothiophene, and the counter-ion to the thiophene salt is bromide. Another by-product is therefore hydrogen bromide which readily attacks ITO and can cause the release of detrimental products into the film which quenches the photoluminescence. The conversion by-products of the PPV-based precursor are indicated in FIG. 2 where a=0, a'=0.

Without the anode protection layer, initial measurements of PL efficiency of the PPV material were reduced from about 13% to, at best, about 0.7% following the thermal conversion process. Further measurements established that the PL efficiency may be in the range 10% down to about 2-3%. Initial measurements with the anode protection layer indicated a PL efficiency of ~3%. Subsequent work has shown that this can be increased to ~5%. After the conversion a suitable cathode material, calcium for instance, is deposited on top of the conjugated polymer 8 and patterned to form strips 10. After thac, contacting and encapsulation with epoxy/glass were immediately performed in a glove box. Devices made with the protector layer typically have significantly improved electroluminescence efficiency compared to the devices without the protector layer 6.

Embodiment II

Another specific embodiment is now described. The initial steps are the same as embodiment 1 up to formation of the EL layer. In this embodiment, a precursor to an acetate-based PPV copolymer is deposited. This material has a very high photoluminescence (PL) efficiency, where the solubilising group that is removed during conversion is tetrahydrothiophene, and the counter-ion to the thiophene salt is bromide. Another by-product is therefore hydrogen bromide which readily attacks ITO and can cause the release of detrimental products into the film which quenches the photoluminescence and causes enhanced conversion. Without the anode protection layer 6, the PL efficiency of the PPV material is dramatically reduced from about 50-60% to, at best about 7% following the thermal conversion process (150° C. in nitrogen for 4 hours as before). However, with the protector layer a PL efficiency of ~22% is obtained following conversion. FIG. 2 shows the conversion system, where a≠0, a'≠0. After the conversion a suitable cathode material, calcium for instance, is deposited on top of the conjugated polymer.

Table 1 illustrates the photoluminescent efficiencies for embodiments I and II, in the final column of Table 1. The first and second columns of Table 1 illustrate values for the photoluminescence efficiency in situations where the precursor layer is spin-coated onto quartz and indium tin oxide respectively without the use of the anode protection layer. Table 1A shows equivalent figures resulting from what we believe are more accurate measurements with a better statistical base.

The copolymer referred to in this case was measured initially to contain ~20 mol. % of the acetate function. Subsequent measurements which we believe to be more accurate indicate a content of ~40 mol. % of the acetate function. Modification of the copolymer acetate level has led to photoluminescence efficiencies of about 30% when converted on ITO with the PEDT/PSS protection layer.

Figure 3A:
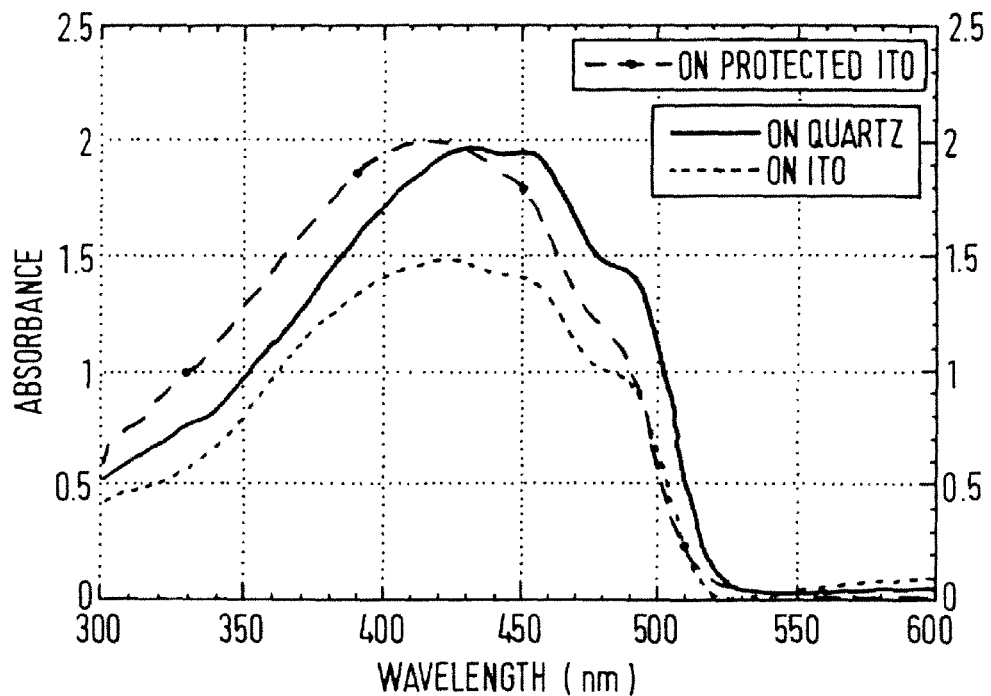
FIGS. 3A and 3B are graphs illustrating the UV-vis spectra of PPV homopolymer respectively converted on quartz, indium tin oxide and an anode protection layer.
Figure 3B:
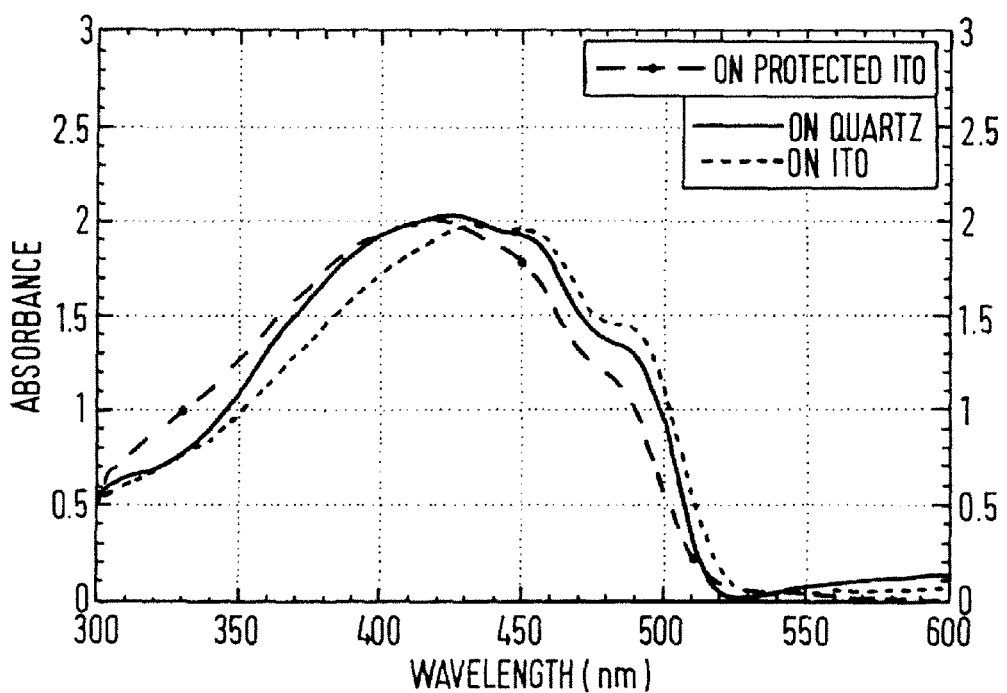
Figure 4:
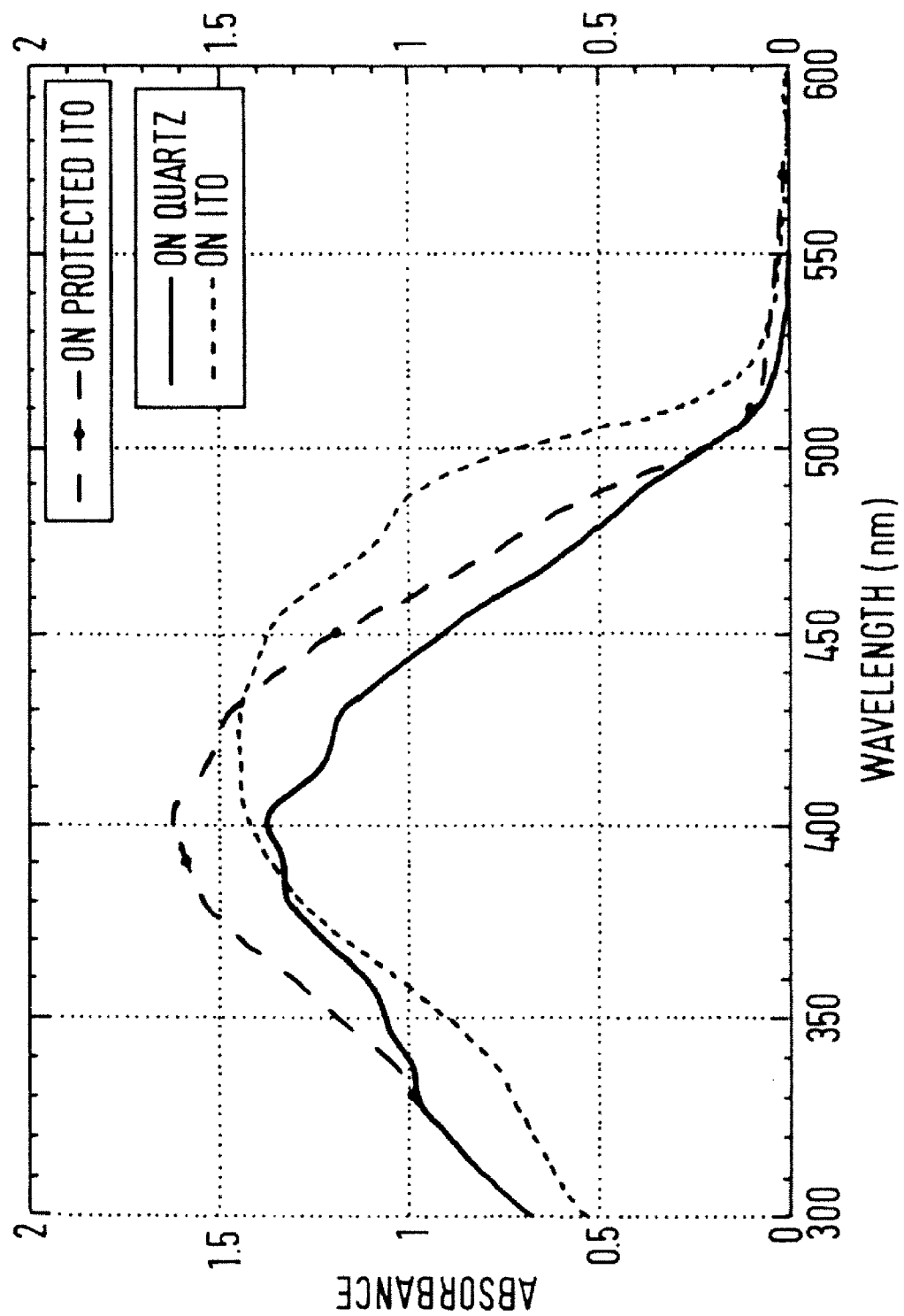
FIG. 4 is a graph illustrating the UV-vis spectra of PPV copolymer converted on quartz, indium tin oxide and an anode protection layer.

FIGS. 3 to 5 show that protection of the PPV copolymer is also brought about minimising the enhanced conversion with the ITO protection layer. FIG. 3A illustrates measurements taken from structures having differing layer thicknesses. FIG. 3B shows the situation where a common layer thickness is used. FIG. 3B illustrates that the UV-vis spectra show little change in the homopolymer case irrespective of the substrate used. However, FIG. 4 shows that there is an enhanced red shift for the acetate based copolymer when converted on ITO. In addition, there is an absorption peak at 1737 cm$^{-1}$ in the IR spectra which is assigned to the acetate carbonyl absorption. The relative intensity of this can be compared with other peaks in the spectrum, such as the absorption at 1517 cm-1 which originates in the aromatic constituents of the polymer. The ratio of the intensities of the two peaks therefore gives a measure of the relative quantities of the acetate function. Table 2 shows that this ratio (acetate:aromatic) is significantly reduced when the conversion is carried out on silicon with an indium layer. We interpret these results as enhanced conversion of the acetate based copolymer by indium compounds from the silicon substrate with indium layer and this process is reduced by the presence of protection layers. Relative photoluminescence efficiencies are detailed in Tables 1A and B. The device performance of the systems including the protection layer may be summarised as 100 cd/m2 starting brightness, efficiency of 0.2-0.6 µm/W and up to 2 µm/W, with a half-life of brightness (at constant current or constant voltage drive) of 10-100 hours, and up to 2000 hours.

Embodiment III

Another specific embodiment is now described. In this embodiment, the production steps are the same for Embodiment II except that the polyethylene dioxythiophene/polystyrene sulphonate material which is used as the anode protection layer has been optimised to give beneficial lifetime performance by increasing the PSS content. Thus, the material now has a 1:5 molar ratio PEDT/PSS. The device performance of these system may be summarised as 100 cd/m2 starting brightness, efficiency of 0.3-1.2 lm/w, and up to 2 lm/w with a half-life of ~500 hours and up to 2000 hours.

Embodiment IV

Figure 1B:
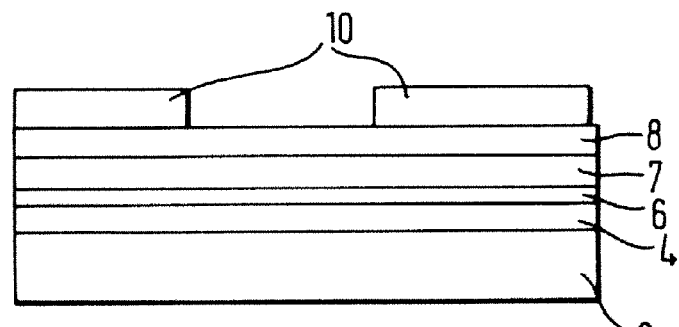

In the case of Embodiment III, we have observed a detrimental interaction between the PEDT/PSS protection layer (@ 1:5 molar ratio) with the PPV precursor solution. We believe this is because of dissolution of the PEDT/PSS layer in the PPV precursor solution and this can lead to non-uniform emission in the final device. For example, if the PPV is spin-coated on top of the PEDT/PSS film during device fabrication then a circular non-uniformity is observed at the PEDT/PSS-PPV interface after conversion. We have overcome this problem by spin-coating a thin poly(vinyl pyridine) (PVP) film (FIG. 1B-reference 7) on top of the PEDT/PSS layer before the PPV precursor solution is applied. As is well understood, commercially available PVP includes a component of polystyrene, typically 10%, to render it soluble. Hence, a 100 Å film of the PEDT/PSS system is deposited as described above and following this a thin PVP film is spin-coated from a 0.1% w/v solution in methanol. The rest of the device is manufactured in the normal way and characteristics as outlined above are obtained (i.e. 100 cd/m2 initial brightness, 6.3-1.2 µm/W efficiency, with a half-life of ~500 hours). However, the emission uniformity is greatly improved. As the PVP acts as a barrier between the PEDT/PSS system and the PPV, this approach can also be used to pattern this ITO protection layer.

Embodiment V

Figure 1C:
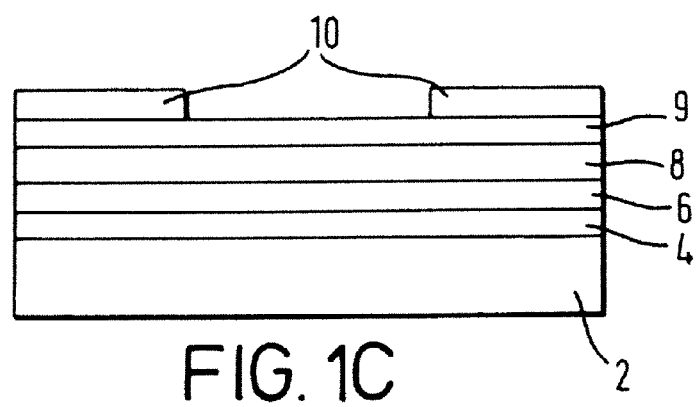

A further specific embodiment is now described and relates to the fabrication of such devices. A sheet of ITO coated glass is taken and cleaned. The dimensions of the ITO-coated glass may be from 12*12 mm to much greater than 80*80 mm. The PEDT/PSS ITO protection layer is then spin-coated onto the substrate to a thickness of ~100 Å. Following this the PPV precursor solution is blade-coated onto the PEDT/PSS layer at a wet film thickness of 100 µm at a precursor solution concentration of 0.4-0.5% solid content. In this case the device uniformity is superior to that obtained when the PPV precursor is spin-coated. Alternatively, a double layer PPV device may be blade-coated such that each layer is ~500-700 Å thick and a short conversion (~20 minutes at 150° C.) is carried out before deposition of the second layer (reference 9 in FIG. 1C). After conversion the final conversion the PPV film obtained is ~1000-1400 Å thick. In this case beneficial effects are observed with respect to device efficiency and gross uniformity. A suitable cathode is then deposited and the device is connectorised.

Embodiment VI

In another embodiment, a glass substrate is coated with indium tin oxide in the manner described above. Then, PVP was dissolved in methanol to a concentration of 0.1%, prefiltered to 1 micron pore size and coated onto the indium tin oxide to a thickness of about 100 Å. Then, the PPV precursor discussed above with reference to Embodiment I is spin-coated on top and converted at 150° C. in nitrogen for 4 hours to render a layer of PPV of about 1000 Å thickness. The device was then stored in a desiccator for 48 hours before a cathode formed from an aluminium/lithium alloy was sputtered on top.

Embodiment VII

This embodiment was formed in the same manner as Embodiment VI, except that the anode protection layer was formed of polyvinylcarbazole (PVK) dissolved in THF to a concentration of 0.1%.

Embodiment VIII

This embodiment was formed in the same manner as Embodiments VI and VII except that the anode protection layer was formed of polystyrene dissolved in THF to a concentration of 0.1.

Embodiment IX

This embodiment was formed in the same manner as Embodiments VI, VII and VIII except that the anode protection layer was formed of poly(vinyl pyridine) dissolved in methanol to a concentration of 0.1%.

Embodiment X

In another embodiment, the device is manufactured according to Embodiment II, but the cathode is formed of a lithium/aluminium alloy instead of calcium. For instance a lithium/aluminium alloy containing up to 10% by weight Li, is sputtered on top of the conjugated polymer to a thickness of 10 Å-1 µm and preferably 1200 Å. The Li/Al alloy targets are commercially available and can typically contain ~2.5% by weight Li. Other stabilising elements such as Zr, Mg, Cu may also be present. Devices made with the protector layer and the lithium based cathode have significantly improved electroluminescence efficiencies compared to the devices without the protector layer and using say calcium electrode.

Thus, the various embodiments described above of the present invention each provide a multilayer electroluminescent device incorporating a converted precursor polymer as the emitting layer and an electrode protecting layer placed between the converted precursor polymer and the underlying electrode and which acts to protect the electrode during the precursor conversion process. At least one other layer is present one of which is the second electrode.

The embodiments described above are illustrative of a method of manufacture of an electroluminescence device wherein a precursor to a conjugated polymer material is deposited on a substrate on which has previously been deposited both an electrode layer and subsequently an electrode protection layer. The precursor is then converted to the final conjugated polymer form before deposition of a subsequent layer or layers at least one of which is the second electrode.

TABLE 1

TYPICAL PHOTOLUMINESCENCE EFFICIENCY (%) MEASUREMENTS

| Polymer Type | PL eff/Quartz | PL eff/ITO | PL eff/Protection Layer/ITO |
|---|---|---|---|
| Homopolymer | 13.2 | 0.7 | 3 |
| Copolymer | 56 | 6.8 | 22 |

TABLE 1A

IMPROVED PHOTOLUMINESCENCE EFFICIENCY (%) MEASUREMENTS

| Polymer Type | PL eff/Quartz | PL eff/ITO | PL eff/Protection Layer/ITO |
|---|---|---|---|
| Homopolymer | 10 | 2-3 | 4-5 |
| Copolymer | 50-60 | 7 | 20 |

TABLE 2

1737/1517 cm-1 Ratios (Acetate:Carbonyl) from IR spectra

| Substrate | 1737/1517 cm-1 Ratio* |
|---|---|
| Inert (Si) | 1.1 |
| Si with indium layer with protection | 1 |
| Si with indium layer | 0.3 |

The invention claimed is:

1. A method of manufacturing an organic electroluminescent device comprising:
    depositing an anode formed of a positive charge carrier injecting material;
    depositing a layer comprising an inorganic metal compound exhibiting hole transport mobility between the anode and a solution processable polymer light emissive layer, wherein the inorganic metal compound is vanadium oxide or molybdenum oxide;
    depositing the polymer light emissive layer comprising depositing a solution processable organic material from solution;
    depositing a cathode formed of a negative charge carrier injecting material; and
    wherein the polymer light emissive layer comprises a conjugated polymer which releases acidic by-products during conversion from a precursor to the conjugated polymer.

* * * * *